(12) United States Patent
Reed et al.

(10) Patent No.: US 7,495,985 B1
(45) Date of Patent: Feb. 24, 2009

(54) METHOD AND SYSTEM FOR MEMORY THERMAL LOAD SHARING USING MEMORY ON DIE TERMINATION

(75) Inventors: David G. Reed, Saratoga, CA (US); Brad W. Simeral, San Francisco, CA (US); Roman Surgutchik, Santa Clara, CA (US); Joshua Titus, Sunnyvale, CA (US)

(73) Assignee: Nvidia Corporation, Santa Clara, CA (US)

( * ) Notice: Subject to any disclaimer, the term of this patent is extended or adjusted under 35 U.S.C. 154(b) by 426 days.

(21) Appl. No.: 10/973,519

(22) Filed: Oct. 25, 2004

(51) Int. Cl.
*G11C 7/04* (2006.01)
(52) U.S. Cl. .................... 365/211; 365/212; 326/30
(58) Field of Classification Search ........... 365/211 O, 365/212 X, 211, 212; 326/30 X, 30
See application file for complete search history.

(56) References Cited

U.S. PATENT DOCUMENTS

| | | | |
|---|---|---|---|
| 5,237,460 A | 8/1993 | Miller et al. | |
| 6,523,102 B1 | 2/2003 | Dye et al. | |
| 6,545,684 B1 | 4/2003 | Dragony et al. | |
| 6,704,022 B1 | 3/2004 | Aleksic | |
| 6,772,352 B1 | 8/2004 | Williams et al. | |
| 6,832,177 B2 | 12/2004 | Khandekar et al. | |
| 6,980,020 B2 * | 12/2005 | Best et al. | 326/30 |
| 7,034,565 B2 * | 4/2006 | Lee | 326/30 |
| 7,061,640 B1 | 6/2006 | Maeda | |

OTHER PUBLICATIONS

Johnson, Chris, "Graphics DDR3 On-Die Termination and Thermal Considerations." Micron Designline, vol. 12, Issue 1. Rev. Apr. 1, 2003. 8 pgs.*

* cited by examiner

*Primary Examiner*—VanThu Nguyen (57) ABSTRACT

Memory component temperature information is used to implement a method for ODT (on die termination) thermal load management. A respective temperature of a plurality of memory components are accessed, and based on this temperature, an ODT cycle is directed to a first of the memory components to avoid imposing a thermal load from the ODT cycle on a second of the memory components.

21 Claims, 5 Drawing Sheets

METHOD AND SYSTEM FOR MEMORY THERMAL LOAD SHARING USING MEMORY ON DIE TERMINATION

CROSS REFERENCE TO RELATED APPLICATION

This application is related to, and incorporates by reference, the commonly assigned U.S. patent application A METHOD AND SYSTEM FOR MEMORY TEMPERATURE DETECTION AND THERMAL LOAD MANAGEMENT, by David Reed et al., filed on Oct. 25, 2004, Ser. No. 10/973,333.

FIELD OF THE INVENTION

The present invention is generally related to computer system memory. More particularly, the present invention is directed towards memory thermal management.

BACKGROUND OF THE INVENTION

As computer systems become increasingly ubiquitous and widespread, there is increasing interest in improving the performance and software execution speed of the computer systems. One of the methods used by designers to increase software execution speed is to increase the processor "clock speed." Clock speed refers to the rate at which digital systems (graphic processor units, central processor units, digital signal processors, etc.) step through the individual software instructions. For example, with many microprocessor designs, one or more instructions are executed per clock cycle. Increasing the number of clock cycles per second directly increases the number of instructions executed per second.

Another method used by designers is to increase the density of the electrical components within integrated circuit dies. For example, many high-performance microprocessors include tens of millions of transistors integrated into a single die (e.g., 60 million transistors or more). As density increases, the clock speeds possible within a given processor design also increase, for example, as circuit traces are packed ever more closely together.

In addition to increasing the processor software execution speed, another method used by designers to increase computer system performance is to increase the memory clock speed. The memory clock speed generally refers to the rate at which computer system memory (e.g., DRAM, SDRAM, RDRAM, etc.) can accept data from, and provide data to, the other components of the computer system (e.g., the CPU, GPU, etc.).

For example, high-performance memory (e.g., high clock speed memory) is typically used in those computer systems equipped with high-performance, high clock speed, processors. Ideally, the high-performance memory should provide sufficient bandwidth to prevent the processor running out of instructions or otherwise occurring idle time waiting for instructions or data. As with microprocessors, increasing the system memory clock speed directly increases the number of instructions that can be provided to the processor, and thus executed, per second.

Increasing processor clock speed and increasing memory clock speed causes increased power dissipation for the components and an increased amount heat. Accordingly, increasing performance also requires an increase in the efficiency of heat removal from the components. As integrated circuit density increases and clock speed increases, the thermal energy that must be dissipated per unit area of silicon also increases. To maintain high-performance, stable operating temperatures must be maintained. Accordingly, the use of carefully designed heat dissipation devices (e.g., heat sink fans, liquid cooling, heat spreaders, etc.) with high-performance processors has become relatively standardized.

Performance enhancing techniques, such as increased component density, increased clock speed, and increased heat dissipation, are carefully balanced in order to obtain an optimum performance level. Processor circuit density, memory component circuit density, clock frequency, and thermal dissipation are balanced to provide high-performance while maintaining some margin of safety. For example, if a processor or memory components are clocked at too high a frequency, excessive power consumption occurs, leading to overheating. Over-heating leads to computational errors, unpredictable behavior, or even physical destruction of processor and/or memory. As more and more functions are integrated into ever more densely packed semiconductor dies, the clock speed can be increased, however, the resulting increased switching activity leads to greater heat generation. These factors are balanced to provide an optimal performance for given device.

There exists particular problems, however, with respect to thermal management of newer types of high-performance memory, such as, for example, DDR II memory. As described above, maximum attainable integrated circuit performance is dependent upon the temperature of the underlying silicon comprising the integrated circuit (e.g., electron mobility, etc.). Generally, for a given semiconductor integrated circuit, cooler semiconductor temperatures yields faster performance (e.g., higher electron mobility) than warmer semiconductor temperatures. Performance factors (e.g., clock frequency, component density, thermal dissipation) are typically optimized with respect to expected steady-state operating conditions. This leads to problems when changing temperature conditions are encountered, or where heavy processing loads are encountered.

For example, for DDR-II it is essential to be able to monitor thermal activity of the DRAMs. The high clock speed of DDR II memory will cause rapid temperature buildup if the memory components are continuously accessed under heavy processing loads. The heat generated, if left unchecked, would destroy the component. Thus, what is required is a method for managing the thermal loads incurred by high-performance memory.

SUMMARY OF THE INVENTION

Embodiments of the present invention provide a method and system for memory thermal management. Embodiments of the present invention monitor thermal activity of the DRAMs comprising the system memory of a computer system and assess the thermal loads incurred by high-performance memory.

In one embodiment, memory component temperature information is used to implement a method for ODT (on die termination) thermal load management. In such an embodiment, a respective temperature of a plurality of memory components are accessed, and based on this temperature, an ODT cycle is directed to a first of the memory components to avoid imposing a thermal load from the ODT cycle on a second of the memory components.

In one embodiment, the memory controller monitors a plurality of ODT cycles directed to the memory components and determines a number of ODT cycles occurring to each of the memory components over a time period. The monitoring enables the averaging of ODT cycles to each of the memory components by selectively directing ODT cycles to the memory components individually. Similarly, in one embodiment, the memory controller determines if the temperature of any one of the memory components exceeds a temperature threshold. If one of the memory components (e.g., one of the ranks) exceeds the temperature threshold, the memory controller can direct ODT cycles away from the overheating memory component.

In this manner, embodiments of the present invention monitor thermal activity of the system memory, thereby ensuring high-performance memory (e.g., DDR II memory, etc.), with its characteristic the high clock speeds, does not incur dangerous temperature buildup if the memory is continuously accessed under heavy processing loads.

BRIEF DESCRIPTION OF THE DRAWINGS

The present invention is illustrated by way of example, and not by way of limitation, in the Figures of the accompanying drawings and in which like reference numerals refer to similar elements.

DETAILED DESCRIPTION OF THE INVENTION

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system (e.g., computer system 100 of FIG. 1), or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
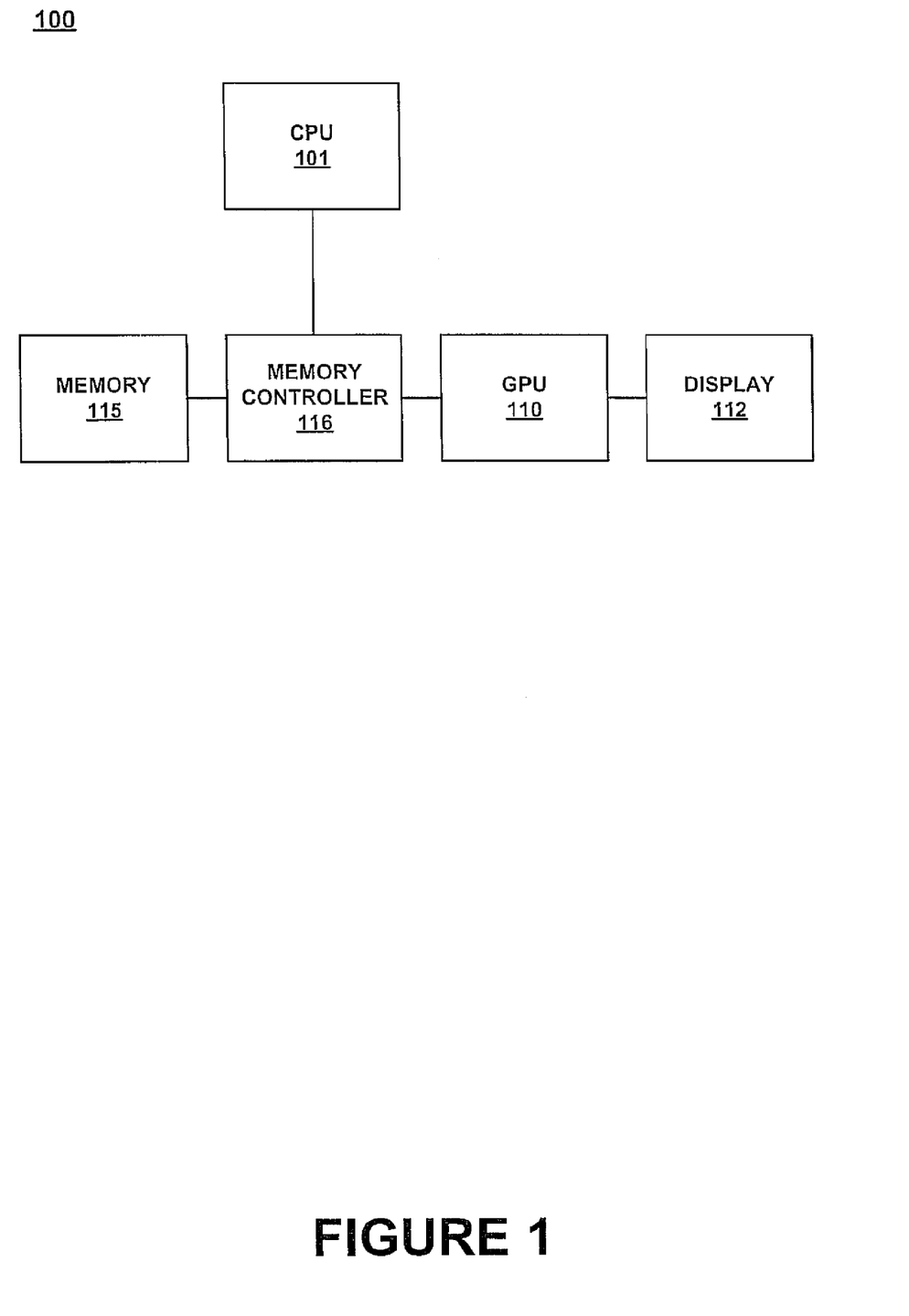
FIG. 1 shows a computer system in accordance with one embodiment of the present invention.

Computer System Platform:

FIG. 1 shows a computer system 100 in accordance with one embodiment of the present invention. Computer system 100 depicts the components of a basic computer system in accordance with one embodiment of the present invention that provides the execution platform for implementing certain hardware-based and software-based functionality of the present invention. As described above, certain processes and steps of the present invention are realized, in one embodiment, as a series of instructions (e.g., software program) that reside within computer readable memory units of a computer system (e.g., system 100) and are executed by the CPU of system 100. When executed, the instructions cause the computer system 100 to implement certain aspects of the functionality of the present invention as described below.

In general, computer system 100 comprises at least one CPU 101 coupled to a system memory 115 and a graphics processor unit (GPU) 110 via one or more busses as shown. Access to the system memory 115 is implemented by a memory controller 116. The GPU 110 is coupled to a display 112. System 100 can be implemented as, for example, a desktop computer system or server computer system, having a powerful general-purpose CPU 101 coupled to a dedicated graphics rendering GPU 110. In such an embodiment, components would be included that are designed to add peripheral busses, specialized graphics memory and system memory, IO devices, and the like.

It should be appreciated that although the GPU 110 is depicted in FIG. 1 as a discrete component, the GPU 110 can be implemented as a discrete graphics card designed to couple to the computer system via a graphics port (e.g., AGP port, PCI Express port, or the like), as a discrete integrated circuit die (e.g., mounted directly on the motherboard), or as an integrated GPU included within the integrated circuit die of a computer system chipset component (e.g., integrated within a Northbridge chip). Additionally, a local graphics memory can be included for the GPU 110 (e.g., for high bandwidth graphics data storage). It should be noted that although the memory controller 116 is depicted as a discrete component, the memory controller 116 can be implemented as an integrated memory controller within a different component (e.g., within the CPU 101, GPU 110, etc.) of the computer system 100. Similarly, system 100 can be implemented as a set-top video game console device such as, for example, the Xbox®, available from Microsoft Corporation of Redmond, Wash.

EMBODIMENTS OF THE INVENTION

Referring still to FIG. 1, in one embodiment, the present invention is implemented as a method for memory temperature measurement. The method includes the step of monitoring a plurality of accesses to a memory component (e.g., a DDR DIMM). One or more such memory components comprise the system memory 115. The accesses are driven by, for example, the CPU 101 or the GPU 110 reading/writing instructions/data to system memory 115.

In one embodiment, the load placed on the one or more memory components comprising system memory 115 is determined by tracking the number of accesses occurring to the memory component over a time period. Tracking the number of accesses occurring over the time period yields a rate of the accesses. This rate directly influences the amount of current dissipated by the memory components, and thus directly influences the amount heat generated by the memory components.

In one embodiment, the type of memory accesses to the memory component is tracked in addition to the rate of the memory accesses. Different types of accesses impose different amounts of thermal load, thereby causing different rates of heating. The memory components dissipate heat in a predictable, deterministic manner. Because the rate of heat dissipation is essentially known for a given system configuration, the temperature of a memory component can be determined by integrating the respective thermal loads for the accesses to the memory component.

In one embodiment, the hardware and software functionality required to implement the tracking of the number and type of accesses and the integrating the respective thermal loads for the accesses is located with the memory controller 116 (e.g., built into the memory controller 116). In a typical computer architecture, accesses to and from the system memory 115 are implemented by the memory controller 116. This attribute makes the location of the hardware/software functionality within the integrated circuit die of the memory controller 116 an optimal solution. The memory controller 116 is well-suited to monitoring both the number of accesses and the type of accesses to each of the memory components comprising the system memory 115.

Referring still to FIG. 1, the thermal dissipation characteristics of the system memory 115 can be calibrated for a number of different computer system configurations. Different computer system configurations will dissipate heat from the system memory 115 in different ways. Factors which influence the heat dissipation include, for example, whether heat spreaders are employed, the amount of airflow through a computer system case, the pattern of air flow across the memory components of the system memory 115, the proximity of the memory components to other heat generating components of the computer system 100 (e.g., proximity to the CPU 101, the GPU 110, etc.), and the like.

Since many computer systems are based on standardized configurations (e.g., ATX motherboards, mini-tower computer cases, rear mounted fans, etc.), the thermal characteristics of a given class a computer system can be assessed and used to calibrate the temperature determination method. Such a calibration should be valid for each computer system of the class (e.g., for each ATX motherboard and case configuration from a given manufacturer).

In one embodiment, accesses to the memory components comprising the system memory 115 are throttled (e.g., by the memory controller 116) if the temperature of one or more of the memory components exceeds a threshold (e.g., maximum operating temperature threshold). The throttling can be accomplished by reducing a clock speed (e.g., memory bus speed, memory clock speed, or the like) of the memory component. The throttling attribute of the present embodiment allows the memory components to be clocked at their full potential. In one embodiment, the throttling is accomplished by limiting cycles to be less than 100% of the actual realized utilization (e.g., reducing the activity factor), as opposed to slowing clocks as described above.

For example, high-performance memory (e.g., DDR II DIMMs) can be clocked at maximum operating frequency to yield maximum performance. Should an overheating condition develop, the clock speed can be dynamically throttled lower to prevent the memory from incurring thermal damage.

In this manner, embodiments of the present invention monitor thermal activity of the system memory, thereby ensuring high-performance memory (e.g., DDR II memory, etc.), with its characteristic the high clock speeds, does not incur dangerous temperature buildup if the memory is continuously accessed under heavy processing loads.

Figure 2:
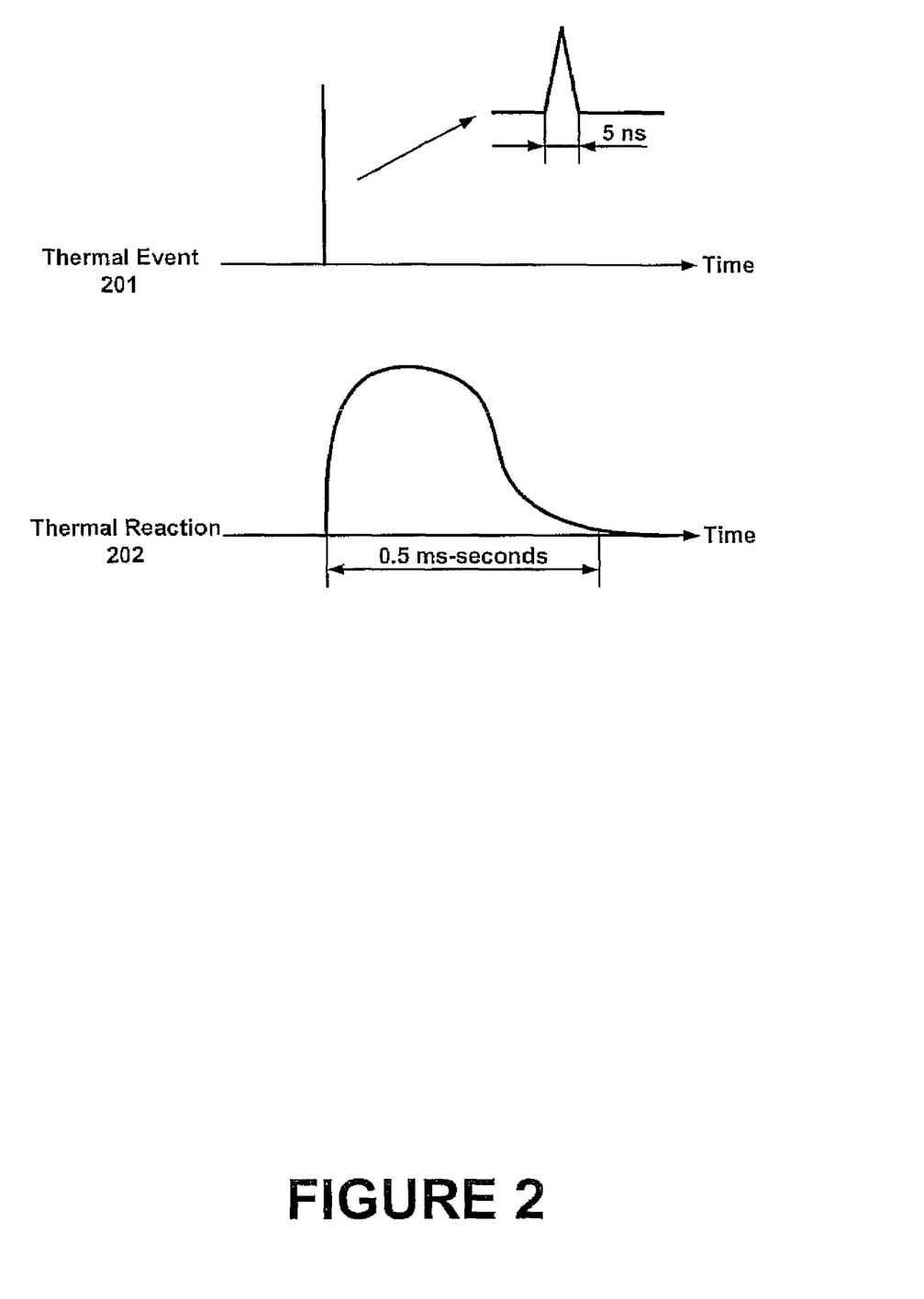
FIG. 2 shows a diagram illustrating a thermal event experienced by a memory component and the resulting thermal reaction in the memory component caused by the thermal event.

FIG. 2 shows a diagram illustrating a thermal event 201 experienced by a memory component and the resulting thermal reaction 202 in the memory component caused by the thermal event 201. In the present embodiment, as described above, for high-performance memory (e.g., DDR II) it is essential to monitor thermal activity of the memory components (e.g., DRAMs) and start throttling if dangerous thermal conditions are detected. One issue is that while a DRAM thermal event (e.g., a memory access) is very short (about 5 ns as shown in FIG. 2), the DRAM's thermal response 202 takes a comparatively long time and can be a fairly complicated function of the thermal event 201.

Embodiments of the present invention implement a method for translating memory access thermal events, such as, for example, precharge (PCHG), on-die termination (ODT), activate (ACT), read (RD), and refresh (RFSH) visible by the memory controller into an "estimated temperature" type of value efficiently and reliably. The temperature determination must be accomplished reliably in order to avoid both "knee-jerk throttling" in the case of short bursts of back to back thermal events and "lax throttling" in the case of spaced thermal events which have no spikes in burstiness, but heat up the memory components. Once an over-heat condition is detected, embodiments of the present invention throttle the performance of the memory component in such a way as not to hurt performance any more than is absolutely necessary while still maintaining fair granularity in the throttling configuration.

Figure 3:
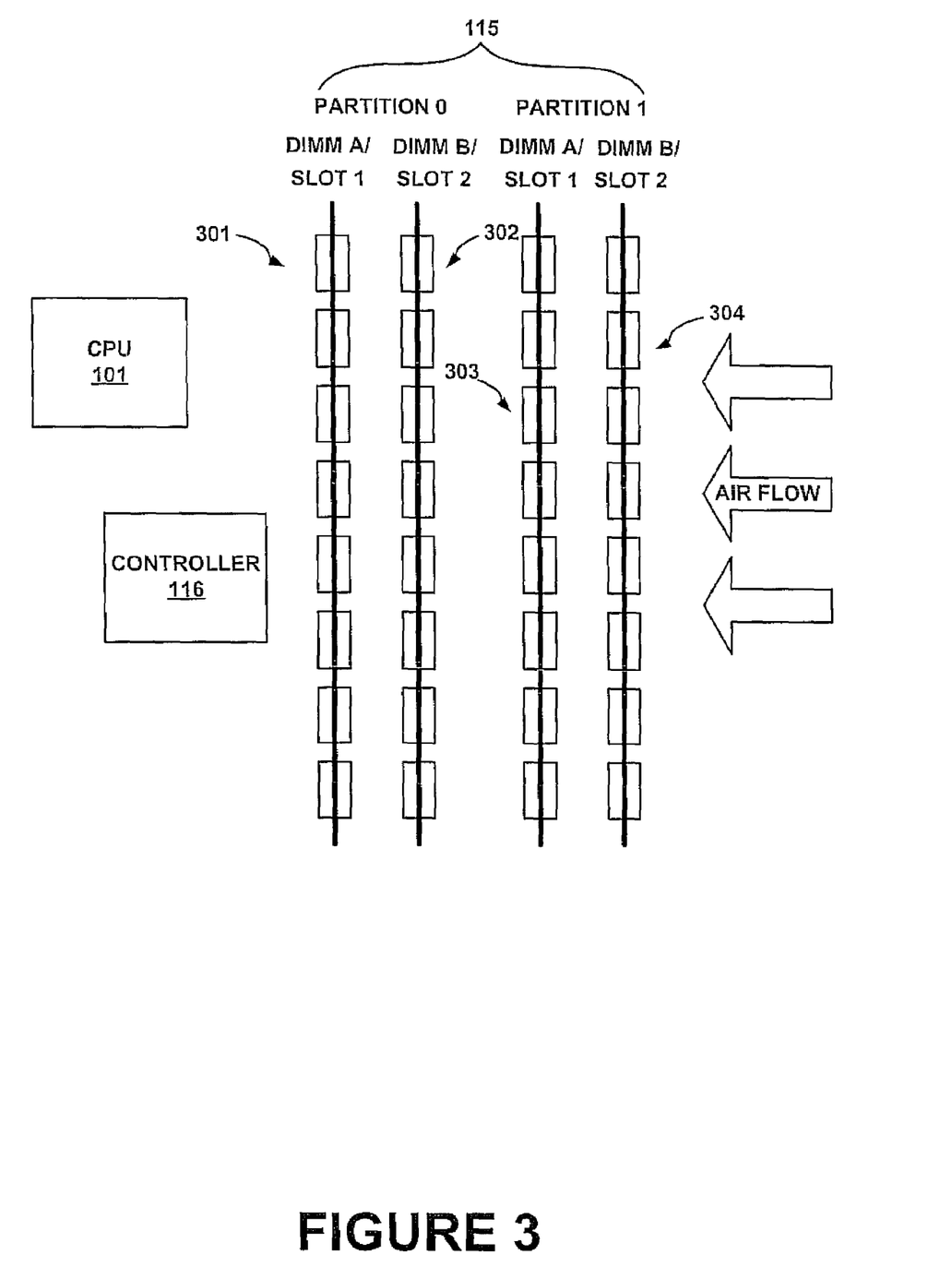
FIG. 3 shows a diagram illustrating a top-down view of a typical ATX form factor motherboard with respect to the locations of the CPU, the memory controller, and the system memory in accordance with one embodiment of the present invention.

FIG. 3 shows a diagram illustrating a top-down view of a typical ATX form factor motherboard with respect to the locations of the CPU, the memory controller, and the system memory 115 in accordance with one embodiment of the present invention. As depicted FIG. 3, the system memory 115 comprises four DIMMs 301-304.

As described above, a number of factors influence the heat dissipation from the memory components 301-304, including, for example, the pattern of air flow across the memory components 301-304 of the system memory 115, as shown in FIG. 3. Because of its proximity to the airflow, memory component 304 will experience a greater degree of cooling than the memory component 301. Thus, it becomes important to determine the respective temperatures of each of the memory components 301-304 to detect whether anyone of them becomes overheated.

Figure 4:
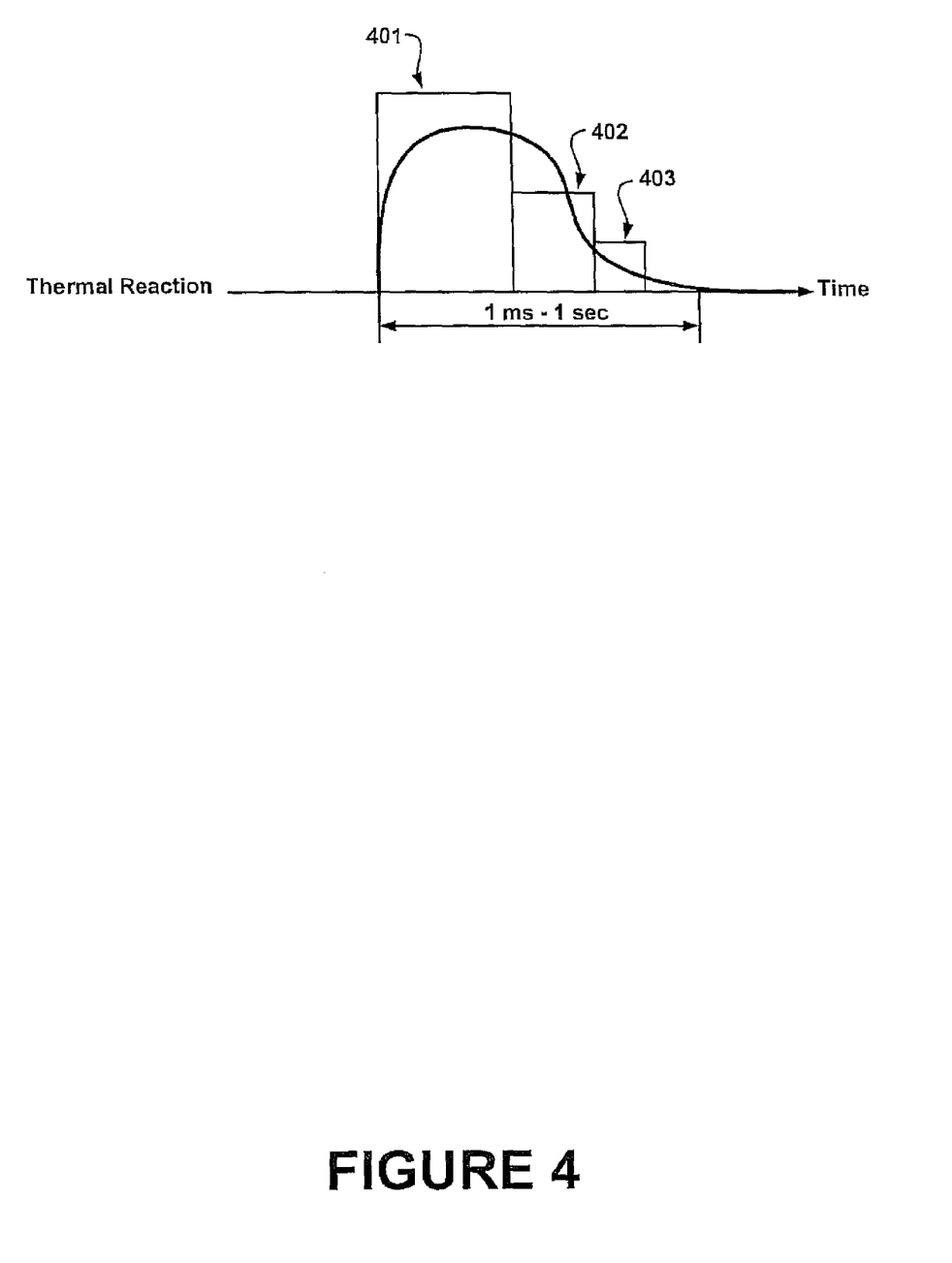
FIG. 4 shows a diagram illustrating the manner in which the temperature of a memory component is determined by integrating the respective thermal load for a plurality of thermal events (e.g., accesses) to the memory component in accordance with one embodiment of the present invention.

FIG. 4 shows a diagram illustrating the manner in which the temperature of a memory component is determined by integrating the respective thermal load for a plurality of thermal events (e.g., accesses) to the memory component in accordance with one embodiment of the present invention.

In one embodiment, the temperature determination integration is implement on a per rank basis (e.g., for each of the DIMMs 301-304). The integration for each rank will account for the thermal events (e.g., PCHG, ODT, ACT, RD or RFSH) on its rank per software configurable time slot (e.g., a configurable time period ranging from 125 us to 125 ms). Configuration/initialization software can specify the thermal contribution of different events (e.g., PCHG, ODT, ACT, RD or RFSH). The integration accounts for the decreasing contribution to temperature a given thermal event makes as time passes. This is shown by the relative sizes of the bounding boxes 401-403 as time progresses. The result of the integration yields an "estimated temperature" that closely approximates the real DRAM thermal response.

In one embodiment, a different cooling scale value for each rank is implemented. The different scale value allows the temperature determination integration to match the "estimated temperature" to the cooling capabilities on a per rank basis. The different cooling scale values also allow a system designer/programmer to specify accurate throttling conditions for more thermally challenged inside ranks of memory (e.g., DIMMs 302-303).

Figure 5:
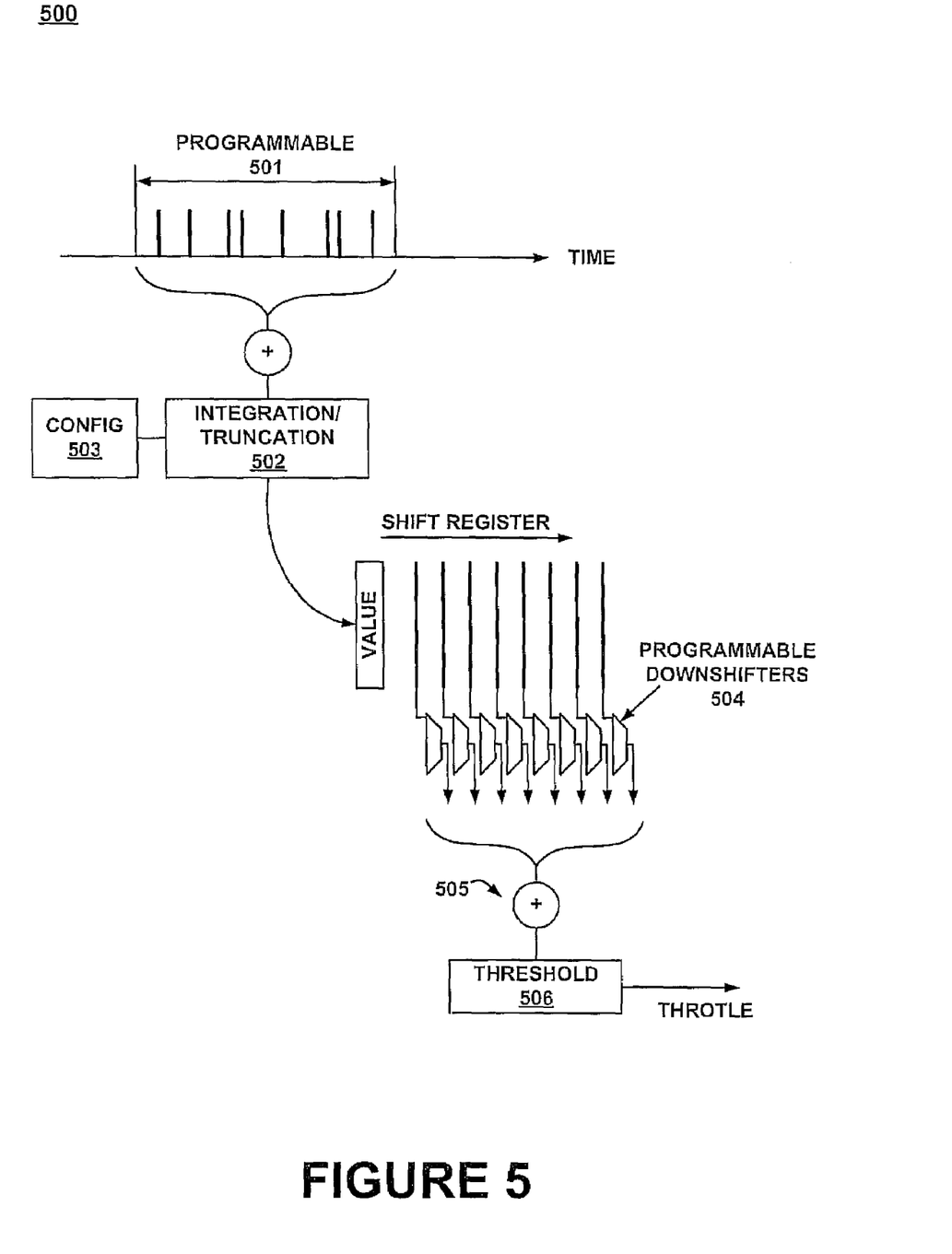
FIG. 5 shows a diagram illustrating a programmable "funnel" shift register for integrating thermal events over a period of time in accordance with one embodiment of the present invention.

FIG. 5 shows a diagram illustrating a programmable "funnel" shift register 500 for integrating thermal events over a period of time in accordance with one embodiment of the present invention. The shift register 500 shows an exemplary implementation of hardware capable of implementing the functionality of the present invention.

As described above, the temperature determination functionality is implemented on a per rank basis. Accordingly, each rank has a corresponding shift register 500 to determine its temperature. Each shift register 500 will look at the thermal events (PCHG, ODT, ACT, RD or RFSH) on its rank per SW configurable time slot 501 and integrate/truncate (e.g., at a truncation circuit 502) the number of thermal events (corresponding to configurable scale) into a temperature value. Configuration/initialization software (e.g., configuration logic 503) will specify the thermal contribution of different events. This value (e.g., five bits) will be sent down the "funnel" shift register advancing on each new timing window. Each consecutive stage will have a programmable downshifter 504 allowing truncation of the values at some points in time, thus simulating cooling of the integrated circuit dies comprising the memory component. The sum 505 of all the FIFO entries (after downshift) yields an "estimated temperature" approximating the real DRAM thermal response. This temperature is checked against a programmable threshold register 506 (e.g., 8-bit register) and is used by a throttling mechanism to determine whether the performance of the memory component should be throttled.

With respect to throttling, in one embodiment, when the temperature threshold is reached on any rank or by explicit throttling command, the memory controller 116 will start throttling that specific rank. For throttling mode, a number of idle DRAM command clocks between each thermal event will be specified for the throttled rank. After issuing a command associated with a thermal event, the memory controller 116 will start counting idle clocks. If another thermal command is pending to this rank before the specified count has been reached, the memory controller 116 can ignore the command until the idle count is satisfied. Eligible commands to other ranks can be granted instead. There is no unnecessary throttling using such a method.

In one embodiment, memory component temperature information is used to implement a method for ODT (on die termination) thermal load management. In such an embodiment, a respective temperature of a plurality of memory components are accessed, and based on this temperature, an ODT cycle is directed to a first of the memory components to avoid imposing a thermal load from the ODT cycle on a second of the memory components.

As described above, one of the thermal events on a memory component (e.g., a DDR II DIMM) is on-die termination (ODT). The DDR-II specification gives some degree of freedom in choosing which rank to use for termination depending on the rank being currently accessed. A simple round robin algorithm is not generally sufficient because different ranks on the same DIMM can have differences in cooling capability of up to 8:1 or higher. Additionally, choosing a rank for directing an ODT cycle cannot be arbitrarily made due to the fact that termination cannot be switched between ranks too often because interrupting a burst in progress to switch termination will force an access bubble. Delaying the switching too long on the other hand, will cause overheating on one of the memory components.

In one embodiment, the memory controller 116 monitors a plurality of DRAM cycles directed to the memory components and determines an estimated temperature for each of the memory components over a time period. The monitoring enables the averaging of ODT cycles to each of the memory components by selectively directing ODT cycles to the memory components individually, thereby averaging DRAM temperatures. Similarly, in one embodiment, the memory controller 116 determines if the temperature of any one of the memory components is lower or higher than other memory components. If one of the memory components (e.g., one of the ranks) is hotter than other components, the memory controller can direct ODT cycles away from the hotter memory component to a cooler memory component (e.g., a coolest eligible-for-ODT memory component). Similarly, in one embodiment, if the temperature of one of the memory components exceeds a temperature threshold, the memory controller 116 can direct ODT cycles away from the overheating memory component.

In one embodiment, a temperature sensor can be incorporated into the memory component, or otherwise mounted on or near the memory component, to directly measure the temperature of the memory component. Such direct temperature measurements can then be used to implement ODT thermal load management. Alternatively, as described above, the number accesses occurring to a memory component within a time can be used to determine the temperature of the memory component. In such an embodiment, the memory controller 116 can generally determine whether one memory component receives a larger number of accesses over a time period than another memory component, and direct ODT cycles away from the memory component that receives the larger number accesses.

It should be noted that in general, the ODT averaging functionality will be closely connected to the thermal monitoring functionality. For example, the thermal monitoring integration hardware can be used as an intelligent equalizing field for ODT averaging.

Each time a choice must be made between possible alternative ODT ranks for termination, the candidate rank with the lowest "temperature" as determined the manner described above can be chosen.

It should be noted that in one embodiment, candidate ranks chosen for receiving ODT cycles are from slots not currently being accessed. Generally, for each time an ODT cycle must be directed to a memory component, it is desirable that all the candidate ranks (e.g., populated ranks corresponding to chosen mode) be examined, and the rank with the lowest temperature chosen.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for memory ODT (on die termination) thermal load management, comprising:
   accessing a respective temperature of a plurality of memory components;
   directing an ODT cycle to a first of the memory components to avoid imposing a thermal load from the ODT cycle on a second of the memory components; and
   throttling accesses to the memory components if the temperature of the first memory component or the second memory component exceeds a threshold.

2. The method of claim 1, further comprising:
   monitoring a plurality of ODT cycles to the memory components; and
   determining a number of ODT cycles occurring to each of the memory components over a time period.

3. The method of claim 2, further comprising:
   averaging ODT cycles to the first memory component and the second memory component by selectively directing ODT cycles to the first memory component and the second memory component.

4. The method of claim 1, further comprising:
   determining if the temperature of the first memory component exceeds a threshold; and
   directing the ODT cycle to the second memory component if the temperature of the first memory component exceeds the threshold.

5. The method of claim 1, further comprising:
   determining whether the first memory component receives a larger number of accesses over a time period than the second memory component;
   directing the ODT cycle to the second memory component if the first memory component receives the larger number of accesses; and
   directing the ODT cycle to the first memory component if the second memory component receives the larger number of accesses.

6. The method of claim 1, further comprising:
   monitoring a respective temperature of the memory components; and
   directing the ODT cycle to the second memory component if the first memory component has a higher temperature than the second memory component; and
   directing the ODT cycle to the first memory component if the second memory component has a higher temperature than the first memory component.

7. The method of claim 1, further comprising:
   throttling accesses to the memory components on a per rank basis if the temperature of the first memory component or the second memory component exceeds a threshold.

8. The method of claim 1, wherein the memory components comprises DDR II memory modules.

9. The method of claim 1, wherein the first memory component comprises a first rank of memory and the second memory component comprises a second rank of memory.

10. A system for memory ODT (on die termination) thermal load management, comprising:
    accessing a respective temperature of a plurality of memory components; and
    directing an ODT cycle to a first of the memory components to avoid imposing a thermal load from the ODT cycle on a second of the memory components, wherein the memory controller monitors a plurality of ODT cycles to the memory components and determines a number of ODT cycles occurring to each of the memory components over a time period.

11. The system of claim 10, wherein the memory controller throttles accesses to the memory components if the temperature exceeds a threshold.

12. The system of claim 10, wherein the memory controller averages ODT cycles to the first memory component and the second memory component by selectively directing ODT cycles to the first memory component or the second memory component.

13. A method for memory ODT (on die termination) thermal load management, comprising:
    monitoring a plurality of ODT cycles to a plurality of memory components;
    determining a number of ODT cycles occurring to each of the memory components over a time period;
    accessing a respective temperature of the memory components; and
    directing an ODT cycle to a first of the memory components to avoid imposing a thermal load from the ODT cycle on a second of the memory components.

14. The method of claim 13, further comprising:
    monitoring a plurality of ODT cycles to the memory components; and
    determining a number of ODT cycles occurring to each of the memory components over a time period.

15. The method of claim 14, further comprising:
    averaging ODT cycles to the first memory component and the second memory component by selectively directing ODT cycles to the first memory component and the second memory component.

16. The method of claim 13, wherein the threshold is a software programmable threshold.

17. The method of claim 13, further comprising:
determining whether the first memory component receives a larger number of accesses over a time period than the second memory component;
directing the ODT cycle to the second memory component if the first memory component receives the larger number of accesses; and
directing the ODT cycle to the first memory component if the second memory component receives the larger number of accesses.

18. The method of claim 13, further comprising:
monitoring a respective temperature of the memory components; and
directing the ODT cycle to the second memory component if the first memory component has a higher temperature than the second memory component; and
directing the ODT cycle to the first memory component if the second memory component has a higher temperature than the first memory component.

19. The method of claim 13, further comprising:
throttling accesses to the memory components on a per rank basis if the temperature of the first memory component or the second memory component exceeds a threshold.

20. The method of claim 13, wherein the memory components comprises DDR II memory modules.

21. The method of claim 13, wherein the first memory component comprises a first rank of memory and the second memory component comprises a second rank of memory.

* * * * *